(12) United States Patent
Ozaki et al.

(10) Patent No.: US 9,042,481 B2
(45) Date of Patent: May 26, 2015

(54) TRANSMITTER AND TRANSMISSION METHOD

(75) Inventors: Keisuke Ozaki, Tokyo (JP); Akihiro Okazaki, Tokyo (JP); Koji Tomitsuka, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 14/116,949

(22) PCT Filed: Sep. 7, 2012

(86) PCT No.: PCT/JP2012/072959
§ 371 (c)(1),
(2), (4) Date: Nov. 11, 2013

(87) PCT Pub. No.: WO2014/038072
PCT Pub. Date: Mar. 13, 2014

(65) Prior Publication Data
US 2014/0334572 A1    Nov. 13, 2014

(51) Int. Cl.
*H04L 27/00* (2006.01)
*H04L 27/12* (2006.01)
*H04L 27/20* (2006.01)
*H04L 27/26* (2006.01)
*H04B 1/04* (2006.01)

(52) U.S. Cl.
CPC ............... *H04L 27/12* (2013.01); *H04L 27/20* (2013.01); *H04L 27/2621* (2013.01); *H04B 1/0475* (2013.01); *H04B 2001/045* (2013.01); *H04L 27/2614* (2013.01)

(58) Field of Classification Search
CPC ... H04L 27/12; H04L 27/2614; H04L 27/368; H04B 1/0475; H04B 2001/045; H03F 3/24; H03F 1/3241; H03F 1/3247
USPC .......................... 375/260, 295, 298, 299, 340
See application file for complete search history.

(56) References Cited

U.S. PATENT DOCUMENTS 6,215,430 B1    4/2001    Smith et al.
7,136,423 B1    11/2006   Duvaut et al.
(Continued)

FOREIGN PATENT DOCUMENTS

CN    101087290 A    12/2007
JP    2001 358561    12/2001
(Continued)

OTHER PUBLICATIONS

Japanese Office Action issued Feb. 25, 2014 in Patent Application No. 2013-512690 with Partial English Translation.
(Continued)

*Primary Examiner* — Syed Haider
(74) *Attorney, Agent, or Firm* — Oblon, McClelland, Maier & Neustadt, L.L.P.

(57) ABSTRACT

A transmitter is capable of suppressing a PAPR to be low and efficiently amplifying transmit power. The transmitter generates a transmission signal by oversampling a modulated signal, and includes a modulation unit that performs a modulation process on an information sequence and that generates a constant envelope signal and a phase interpolation unit that inserts a predetermined number of signals identical in amplitude to signal points of the constant envelope signal between the signal points so that signal points including original signal points are located equidistantly.

10 Claims, 11 Drawing Sheets

(56) References Cited

U.S. PATENT DOCUMENTS

| | | | |
|---|---|---|---|
| 7,397,860 B1 | 7/2008 | Duvaut et al. | |
| 2008/0019453 A1* | 1/2008 | Zhao et al. | 375/260 |
| 2008/0106333 A1* | 5/2008 | Liu | 330/149 |
| 2009/0245429 A1 | 10/2009 | Furuta et al. | |
| 2010/0165829 A1* | 7/2010 | Narasimha et al. | 370/210 |

FOREIGN PATENT DOCUMENTS

| | | |
|---|---|---|
| JP | 2002 543655 | 12/2002 |
| JP | 2009 232426 | 10/2009 |
| WO | 2010 078061 | 7/2010 |

OTHER PUBLICATIONS

Ozaki, Keisuke. et al., "A study on Direct-Sequence Spread Spectrum Scheme with Low PAPR", Information Technology R&D Center, Mitsubishi Electric Corporation, p. 390, (2011).

International Search Report Issued Oct. 9, 2012 in PCT/JP12/072959 Filed Sep. 7, 2012.

Office Action Issued Aug. 20, 2013 in Japanese Application No. 2011 183096 Filed Aug. 9, 2013 (with English translation).

Combined Office Action and Search Report issued Dec. 2, 2014 in Chinese Patent Application No. 201280028673.7 (with partial English language translation and English Translation of Category of Cited Documents).

* cited by examiner

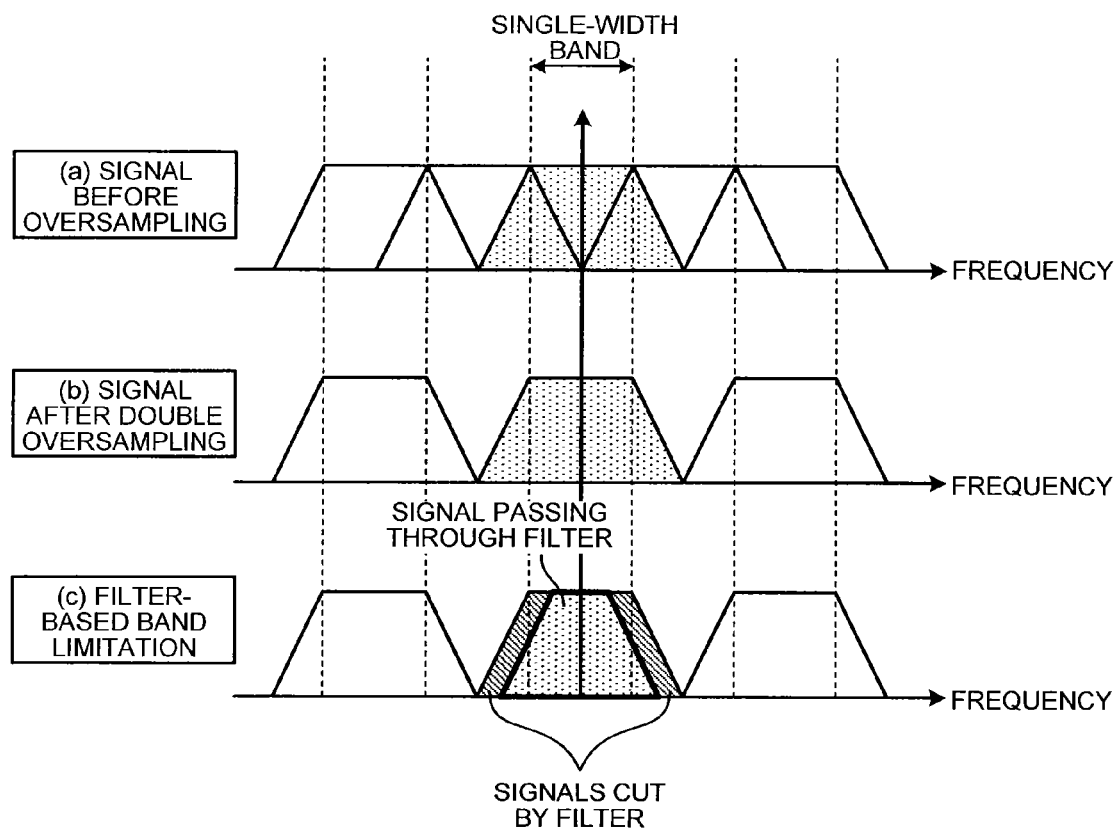

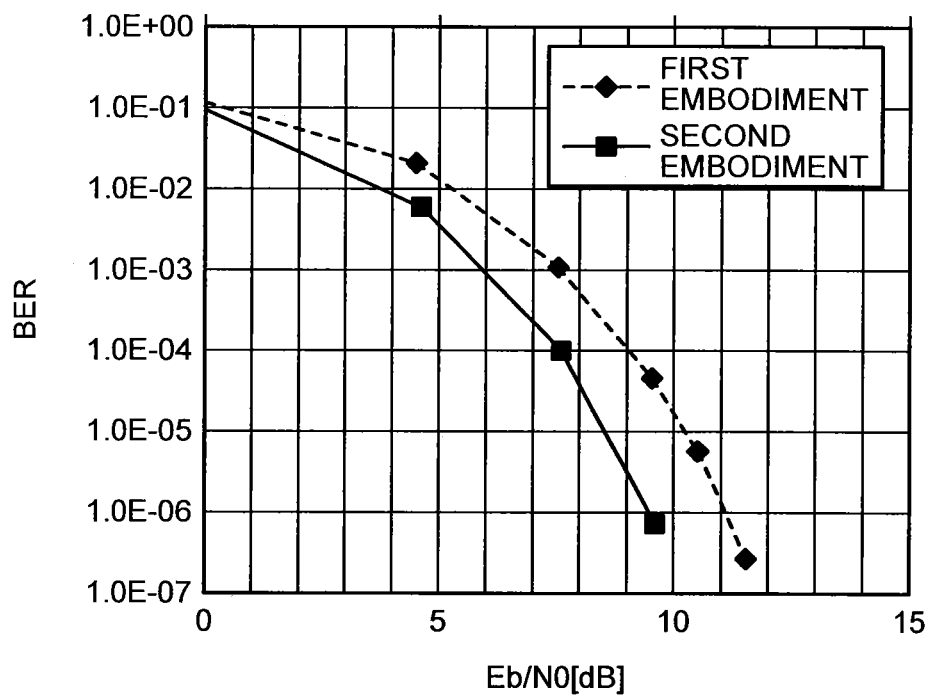

TRANSMITTER AND TRANSMISSION METHOD

FIELD

The present invention relates to a transmitter that generates a transmission signal by oversampling a constant envelope signal.

BACKGROUND

A ratio of peak power to average power of a signal is referred to as "PAPR (Peak to Average Power Ratio)". To improve the operating efficiency of a power amplifier in a transmitter, it is necessary to reduce a backoff in the power amplifier. For the reduction of the backoff, the PAPR of a transmission signal is preferably low. Accordingly, for example, when the transmission signal is a constant envelope signal having a constant amplitude, the PAPR of the transmission signal can be set to 0 dB because the signal power of the transmission signal is always constant.

Generally, the transmitter oversamples a signal, performs a band-limiting process on the oversampled signal, and then transmits the signal. Specifically, as described in Patent Literatures 1 and 2 or the like, V−1 zeros are inserted between samples of the signal, thereby multiplying a signal length by V (V-times oversampling). Thereafter, a band-limiting filter performs the band-limiting process on the oversampled signal. As the band-limiting filter, a root roll-off filter is often used.

CITATION LIST

Patent Literatures

Patent Literature 1: Japanese Patent Application Laid-open No. 2001-358561
Patent Literature 2: Japanese Patent Application Laid-open No. 2009-232426

SUMMARY

Technical Problem

However, when a band limitation is performed after oversampling a signal as described above, it is difficult to realize a constant envelope signal. In practice, it is easy to obtain a constant envelope signal from a signal on which an oversampling process is not performed yet. However, when the signal is subjected to the band limitation after the oversampling process has been performed on the signal, out-of-band signals are cut, resulting in a change in a signal amplitude. That is, as shown in FIG. 12, the band-limited signal is not transformed into the constant envelope signal and the PAPR of the signal becomes higher than 0 dB. In this way, it is normally difficult to obtain the constant envelope signal from the band-limited signal.

FIG. 13 depicts this state in a frequency domain. In a case where a constant envelope signal that is not oversampled yet has a frequency spectrum as shown in (a) in FIG. 13, when this signal is subjected to double oversampling, the signal is transformed to have a frequency spectrum shown in (b) in FIG. 13, at which time, the signal still remains a constant envelope signal. However, by performing band limitation using a filter as shown in (c) in FIG. 13, out-of-band signals are cut and the signal is no longer a constant envelope signal. As a result, the PAPR increases.

For example, there is a sequence called "CAZAC (Constant Amplitude Zero Auto-Correction) sequence", which is characterized by a constant amplitude. However, it is before an oversampling process that this sequence has a constant amplitude, and the sequence loses constant amplitude characteristics by being band-limited after being oversampled, which causes a problem of an increase in peak power. This problem is reported in "3GPP, R1-061284, Fujitsu, "Cubic Metric properties of CAZAC sequences", 2006/5".

The problem that a signal having a constant amplitude before being oversampled loses the constant amplitude characteristics by being band-limited after being oversampled as described above also occurs to general PSK and FSK signals. Accordingly, even when a constant envelope signal is generated so as to reduce the PAPR and to improve the operating efficiency of the power amplifier, the amplitude of the signal is not constant as long as the signal is oversampled by inserting zero signals and is then band-limited by the filter as described in Patent Literatures 1 and 2. That is, the peak power increases and the PAPR increases, resulting in degradation in the operating efficiency of the power amplifier.

The present invention has been achieved to solve the above problems, and an object of the present invention is to provide a transmitter and a transmission method for generating a signal while suppressing a PAPR of the signal to be low.

Solution to Problem

In order to solve above-mentioned problems and achieve the object, according to an aspect of the present invention, there is provided a transmitter that generates a transmission signal by oversampling a modulated signal, the transmitter including: a modulation unit that performs a modulation process on an information sequence and that generates a constant envelope signal; an interpolation unit that inserts a predetermined number of signals identical in amplitude to signal points of the constant envelope signal between the signal points so that signal points including original signal points are located equidistantly; a Fourier transform unit that transforms a signal obtained after the interpolation unit has performed a signal insertion process into a frequency-domain signal; a band-limiting unit that performs band limitation on a frequency-domain signal output from the Fourier transform unit; an addition unit that adds an out-of-band signal that is a signal cut by the band-limiting unit to an in-band signal that is a signal not cut by the band-limiting unit; and an inverse Fourier transform unit that transforms a signal obtained after the addition unit has performed an addition process into a time domain signal.

Advantageous Effects of Invention

According to the present invention, even when a transmission signal is to be generated by oversampling a constant envelope signal having a constant amplitude and further band-limiting the resultant signal, it is possible to generate a transmission signal while suppressing a PAPR of the transmission signal to be low. As a result, it is possible to reduce a backoff in a power amplification unit and to improve the operating efficiency of the power amplification unit.

BRIEF DESCRIPTION OF DRAWINGS

FIG. 13 is an example of a change of a frequency spectrum in a case where oversampling and band-limiting are performed on a constant envelope signal.

FIG. 14 depicts testing conditions of BER characteristics.

FIG. 15 depicts BER characteristics.

DESCRIPTION OF EMBODIMENTS

A transmitter and a transmission method according to exemplary embodiments of the present invention will be explained below in detail with reference to the accompanying drawings. The present invention is not limited to the embodiments. The present invention can be applied for both wireless communications and wired communications.

First Embodiment

Figure 1:
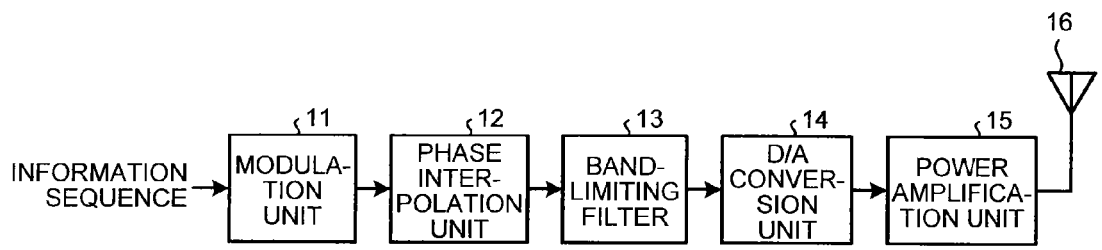
FIG. 1 is a configuration example of a transmitter according to a first embodiment.

FIG. 1 is a configuration example of a transmitter according to a first embodiment of the present invention. As shown in FIG. 1, the transmitter according to the present embodiment includes a modulation unit 11, a phase interpolation unit 12, a band-limiting filter 13, a D/A conversion unit 14, a power amplification unit 15, and an antenna 16.

As described above, the conventional oversampling is to insert zeros between samples. The transmitter according to the present embodiment is characterized by oversampling a signal by performing a phase interpolation. The constituent elements of the transmitter are described below.

The modulation unit 11 performs a modulation process on an input information sequence and generates a transmission signal. In the present embodiment, a modulated signal is assumed as a constant envelope signal having a constant amplitude and expressed as shown in the following equation (1). In the equation (1), j indicates an imaginary unit, $s(n)$ indicates a modulated transmission signal, C indicates an amplitude, $\theta(n)$ indicates a phase, and N indicates a signal length.

$$s(n) = C \cdot \exp\{j\theta(n)\} \quad (0 \leq n < N) \tag{1}$$

The phase interpolation unit 12 performs V-times oversampling ($V \geq 2$) by performing an interpolation process on the transmission signal generated by the modulation unit 11. That is, (V−1) signals are inserted between samples, thereby generating a signal having a length VN. The (V−1) signals are inserted between the samples at this time as follows.

(a) The amplitude of each of the inserted signals is set to C. That is, the signals identical in amplitude to a signal that is not oversampled yet are inserted.

(b) At the time of interpolation between $s(n)$ and $s(n+1)$, (V−1) points are inserted between the $s(n)$ and the $s(n+1)$ so as to equally divide a shorter arc out of arcs each having the $s(n)$ and the $s(n+1)$ as both ends on an IQ plane by V.

At this time, a with $v^{th}$ ($1 \geq v < V$) signal point s_add(n,v) inserted between the $s(n)$ and the $s(n+1)$ is represented by the following equation (2). In the equation (2), * indicates a complex conjugate and f_arg(x) is defined as a function of returning an argument of x in a range $[-\pi, \pi]$.

$$s\_add(n,v) = s(n) \cdot \exp[j \cdot f\_arg\{s(n+1) \cdot s(n)^*\} \cdot v/V] \tag{2}$$

Figure 2:
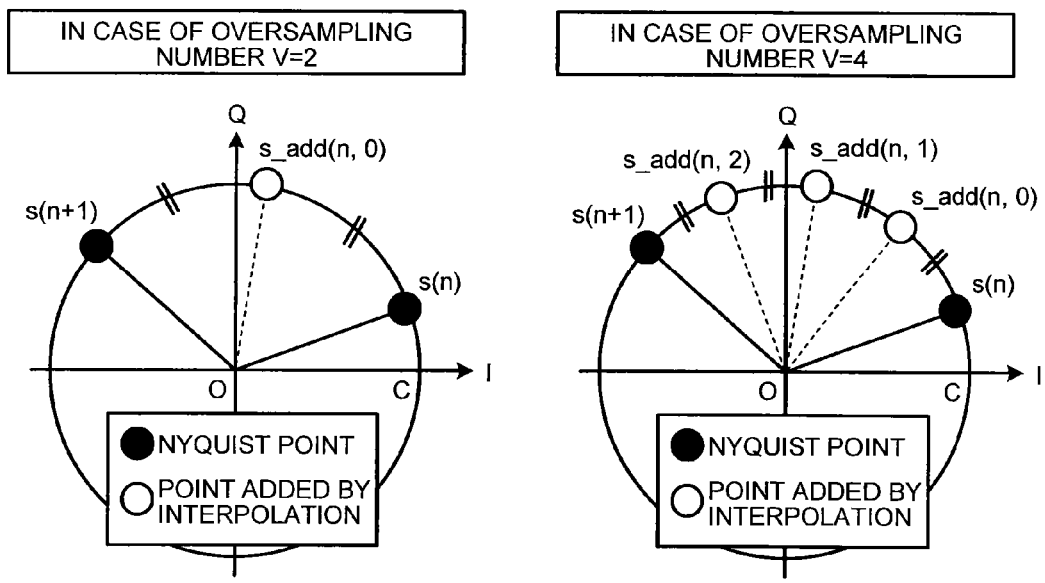
FIG. 2 is an example of an interpolation process performed by a phase interpolation unit.

As an example, FIG. 2 depicts states of the interpolation in cases of V=2 and V=4, respectively. In FIG. 2, the states of the interpolation on the IQ plane are shown. A Nyquist point indicated by a black dot means a point (that is, $s(n)$) present in the signal that is not oversampled yet.

By oversampling the signal by such an interpolation method, an oversampled signal s_ovs(n) is represented by the following equation (3), where k is an integer equal to or larger than 0. The length of this signal s_ovs(n) is VN.

$$s\_ovs(n) = \begin{cases} s(n/V) & (\text{when } n = kV) \\ s\_add(n/V, n-kV) & (kV < n < (k+1)V) \end{cases} \tag{3}$$

The reason for adopting such an interpolation method is described below. By inserting the signals having the amplitude C as described in the (a) mentioned above, the constant envelope signal having the constant amplitude can be obtained from the interpolation-processed signal. However, when the obtained signal is subsequently band-limited using the band-limiting filter, the amplitude of a time domain signal changes and is not constant any longer because of the influence of cutting the out-of-band signals (that is, a PAPR increases to be higher than 0 dB). At this time, when the out-of-band signals cut by the filter can be minimized as much as possible, the PAPR of the signal after passing through the filter can be made close to 0 dB.

Therefore, in the transmitter according to the present embodiment, the phase interpolation unit 12 inserts the signals each having the amplitude C by the method described in the (b) mentioned above. Because a phase change amount $\Delta\theta_1$ per sample of the signal $s(n)$ that is not subjected to the interpolation process is $-\pi \leq \Delta\theta_1 < \pi$, a phase change amount $\Delta\theta\_ovs$ per sample of the signal s_ovs(n) after being subjected to the interpolation process satisfies $-\pi/V \leq \Delta\theta\_ovs < \pi/V$. Because a phase change amount $\Delta\theta$ per sample of the constant envelope signal is generally $-\pi \leq \Delta\theta < \pi$, the phase change amount per sample of the signal s_ovs(n) is 1/V of that of a general constant envelope signal. Because the phase change amount per sample cannot be made smaller, this interpolation method can be said as an interpolation method that can make the phase change amount per sample the smallest.

On the other hand, an angular frequency is obtained by subjecting a phase to temporal derivation. Therefore, the smaller the phase change amount per unit time is, the smaller the high frequency components of the signal become. As described above, because the interpolation method according to the present embodiment is the method that can make the phase change amount per sample the smallest, the method can be also paraphrased as the method of making the high frequency components of the oversampled signal the smallest. That is, the interpolation method according to the present embodiment is the method capable of minimizing the out-of-band signals to be cut by the band-limiting filter used subsequently. As a result, the PAPR of the signal having passed through the filter can be made close to 0 dB.

As an example, consider a case of oversampling the signal $s(n)$ represented by the following equation (4).

$$s(n) = \exp\left(j\frac{\pi}{N}n^2\right) \quad (4)$$

Figure 3:
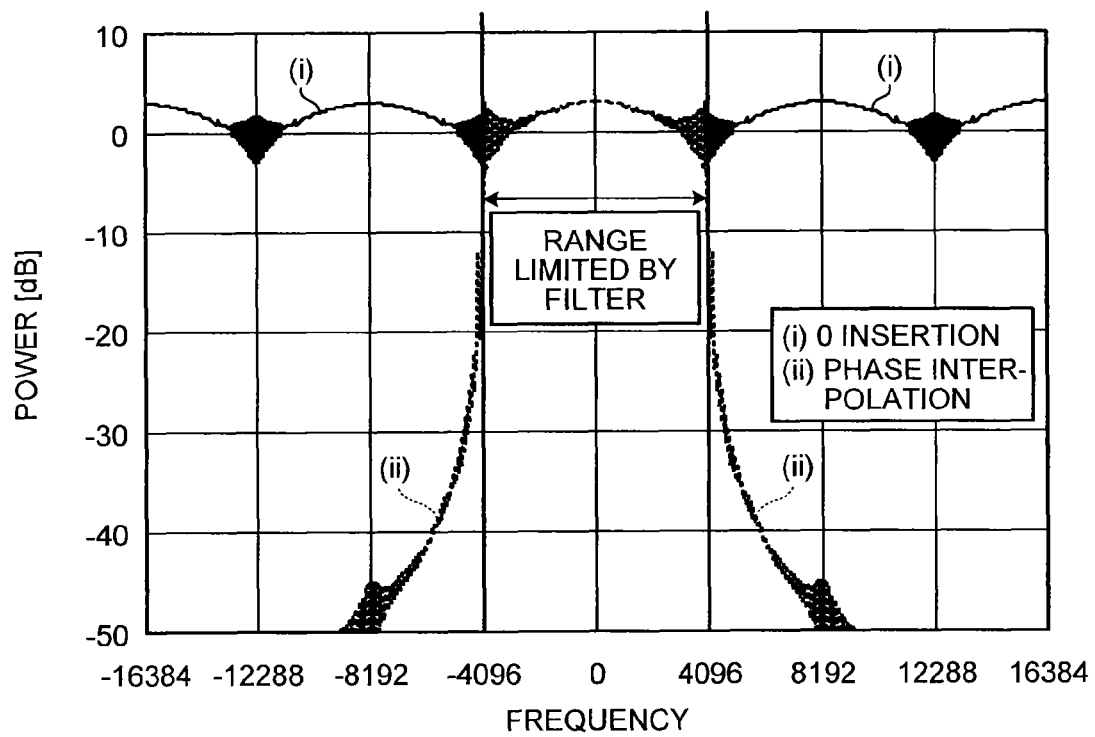
FIG. 3 is an example of a signal spectrum obtained by oversampling a constant envelope signal.

FIG. 3 depicts a signal spectrum in a case (i) of oversampling this signal s(n) by inserting zero signals similarly to conventional technology and a case (ii) of oversampling this signal s(n) by the phase interpolation, respectively. However, FIG. 3 depicts a signal spectrum of the signal s_ovs(n), that is, the signal before being input to the band-limiting filter. The number V of oversampling is four.

As shown in FIG. 3, the high-frequency components of the signal obtained by oversampling the signal s(n) by the phase interpolation are far fewer than those obtained by oversampling the signal s(n) by inserting the zero signals. Because of the four-times oversampling, the band-limiting filter band-limits the signal to a quarter of a band in a range shown in FIG. 3, that is, the band in the range from −4096 to 4096 on a horizontal axis. It is understood that the out-of-band signals cut by the filter at this time are sufficiently fewer than those in the case of inserting the zero signals.

In this way, the oversampling performed by the phase interpolation unit 12 can reduce the out-of-band signals cut by a filtering process to be performed later.

The band-limiting filter 13 is a filter for cutting the out-of-band signals included in the transmission signal and filters the signal output from the phase interpolation unit 12. While the root roll-off filter is normally and often used as the band-limiting filter 13, the type of the filter is not limited to any specific one in the present embodiment.

The D/A conversion unit 14 converts the digital signal output from the band-limiting filter 13 into an analog signal.

The power amplification unit 15 amplifies power of the analog transmission signal output from the D/A conversion unit 14. Because the PAPR of the transmission signal is low in the present embodiment, it is possible to sufficiently reduce a backoff in the power amplification unit 15.

The antenna 16 transmits the analog transmission signal, the power of which is amplified by the power amplification unit 15, to a counterpart device (a receiver).

As already described, it is possible to generate the signal, the out-of-band power of which is sufficiently low, by the phase interpolation process performed by the phase interpolation unit 12. Therefore, it is not necessarily essential to provide the band-limiting filter 13 and it is also possible not to provide the band-limiting filter 13. In the latter case, the signal output from the phase interpolation unit 12 is directly input to the D/A conversion unit 14. When the transmitter is configured as in the latter case described above, the PAPR can be completely set to 0 dB because the out-of-band signals are not cut by the filter.

In the present embodiment, the case of oversampling the modulated signal has been described. However, the method according to the present embodiment is applicable not only to the modulated signal but also to various signals. For example, the method according to the present embodiment is applicable to a case of transmitting a constant-amplitude sequence (the CAZAC sequence, for example) as a pilot signal as it is. In this case, it is unnecessary to use the modulation unit 11 shown in FIG. 1 and it suffices to directly input the to-be-transmitted sequence to the phase interpolation unit 12 and to perform the subsequent processes.

As described above, the transmitter according to the present embodiment inserts the (V−1) signals identical in the amplitude to the constant envelope signal between the sample points of the constant envelope signal at regular intervals (so as to make identical the phase change amount of each of the signals including the sample points of the constant envelope signal) at the time of oversampling the constant envelope signal having the constant amplitude and obtained by modulating the information sequence with the oversampling number V. With this operation, even when the transmission signal is to be generated by oversampling the constant envelope signal having the constant amplitude and by further band-limiting the resultant signal, it is possible to generate the transmission signal while suppressing the PAPR to be low. As a result, it is possible to reduce the backoff in the power amplification unit and to improve the operating efficiency of the power amplification unit.

Second Embodiment

Figure 4:
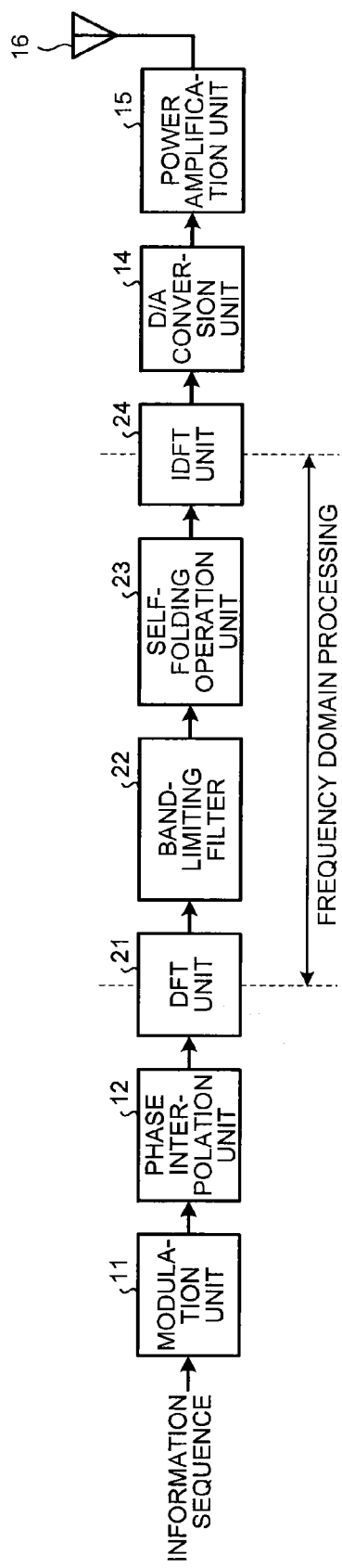
FIG. 4 is a configuration example of a transmitter according to a second embodiment.

FIG. 4 is a configuration example of a transmitter according to a second embodiment of the present invention. The transmitter according to the present embodiment is configured so that a DFT unit 21, a band-limiting filter 22, a self-folding operation unit 23, and an IDFT unit 24 replace the band-limiting filter 13 of the transmitter (see FIG. 1) described in the first embodiment. Elements other than those of the transmitter according to the present embodiment are identical to those of the transmitter according to the first embodiment, and thus same reference signs are denoted and explanations thereof will be omitted.

The transmitter according to the first embodiment can generate a low-PAPR transmission signal. However, the conventional oversampling method by inserting the zero signals is the only method that can prevent waveform distortions from being generated by the band-limiting filter used subsequently, and the oversampling method using the transmitter according to the first embodiment is unable to prevent the waveform distortions from being generated by the band-limiting filter used subsequently. Therefore, when the oversampling method adopted by the transmitter according to the first embodiment is applied, sensitivity characteristics of the receiver degrade and error rate characteristics thereof degrade although the PAPR can be suppressed to be low. Therefore, in the present embodiment, the transmitter capable of reducing degradation in the error rate characteristics is described.

The phase-interpolated signal output from the phase interpolation unit 12 is transformed into a frequency-domain signal by performing a VN-point DFT (Discrete Fourier Transform) on the phase-interpolated signal in the DFT unit 21, and the resultant signal is band-limited in a frequency domain by the band-limiting filter 22. Similarly to the first embodiment, the time domain signal after being subjected to the phase interpolation is defined as s_ovs(n). At this time, when it is defined that the signal after being subjected to the DFT is S_OVS[k], that the band-limited signal by the band-limiting filter 22 is S_FIL[k], and that the signals cut by the band-limiting filter 22 is S_CUT[k], these signals are represented by the following equations (5) as frequency-domain signals.

S_OVS[k]=F[s_ovs(n)]

S_FIL[k]=S_OVS[k]H[k]

S_CUT[k]=S_OVS[k]($H_{max}$−H[k])  (5)

Figure 5:
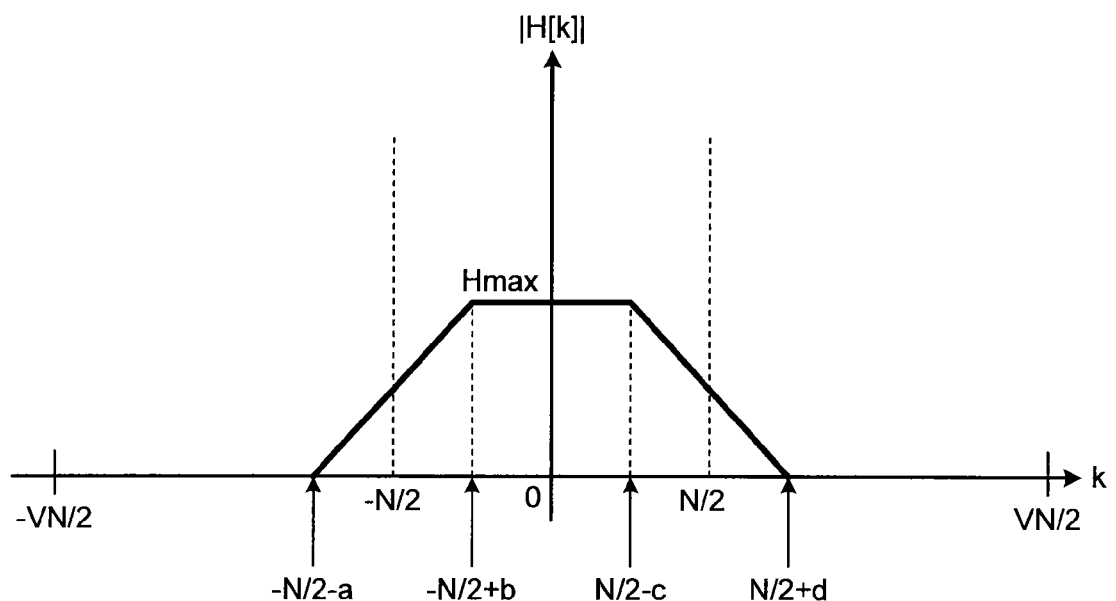
FIG. 5 is an example of frequency characteristics of a band-limiting filter.

In the equations (5), H[k] indicates frequency characteristics of the band-limiting filter 22, $H_{max}$ indicates a maximum value of |H[k]|, and F[x(n)] indicates the DFT performed on x(n). FIG. 5 is an example of the |H[k]|. As shown in FIG. 5, the H[k] is defined by −VN/2≤k<VN/2.

That is, the band-limiting filter 22 can obtain the band-limited signal S_FIL[k] by multiplying the signal S_OVS[k] after being subjected to the DFT by the filter frequency characteristics H[k]. Furthermore, the signals S_CUT[k] cut by the band-limiting process are obtained by multiplying the signal S_OVS[k] after being subjected to the DFT by $H_{max}$−H[k]. The band-limiting filter 22 outputs these signals S_FIL[k] and S_CUT[k] to the self-folding operation unit 23.

The self-folding operation unit 23 adds a part of or all of the signals S_CUT[k] input from the band-limiting filter 22 to the signal S_FIL. At this time, the self-folding operation unit 23 does not make the addition by simply adding a part of or all of the signals S_CUT[k] to the signal S_FIL, but makes the addition by adding a part of or all of the signals S_CUT[k] to the signal S_FIL by folding the signals S_CUT[k] within a band (of the signal S_FIL). Hereinafter, this operation is referred to as "self-folding operation".

The self-folding operation is specifically described.
As shown in FIG. 5, it is assumed as follows.
Among k satisfying |H[k]|=0,
A maximum k, where k<0, is k=−N/2−a, and
A minimum k, where k>0, is k=N/2+d,
Among k satisfying |H[k]|=$H_{max}$,
The minimum k, where k<0, is k=−N/2+b, and
The maximum k, where k>0, is k=N/2−c.

In the above explanations, symbols a to d are real numbers equal to or larger than 0. In a case of using the root roll-off filter or a full roll-off filter as the band-limiting filter 22, the symbols a to d satisfy a=b=c=d.

In the self-folding operation, the self-folding operation unit 23 adds the signals S_CUT[k] to the signal S_FIL according to the following equations (6) to (9). A signal after being subjected to the self-folding operation is defined as S_FOLD[k].

(I) When k<0:
when −N/2≤k<0, $$S\_FOLD[k+N]=S\_FIL[k+N]+S\_CUT[k] \quad (6)$$

when k<−N/2, $$S\_FOLD[k+pN]=S\_FIL[k+pN]+S\_CUT[k] \quad (7)$$

In the equations (6) and (7), p indicates an integer and is selected to satisfy −N/2≤k+pn<N/2.

(II) When k≥0:
when 0≤k<N/2, $$S\_FOLD[k-N]=S\_FIL[k-N]+S\_CUT[k] \quad (8)$$

when k≥N/2, $$S\_FOLD[k-pN]=S\_FIL[k-pN]+S\_CUT[k] \quad (9)$$

In the equations (8) and (9), p indicates the integer and is selected to satisfy −N/2≤k−pn<N/2.

In a case of performing the V-times of oversampling by the phase interpolation, a range of k of each signal is represented by the following equation (10).

$$-VN/2 \leq k < VN/2 \quad (10)$$

Figure 6:
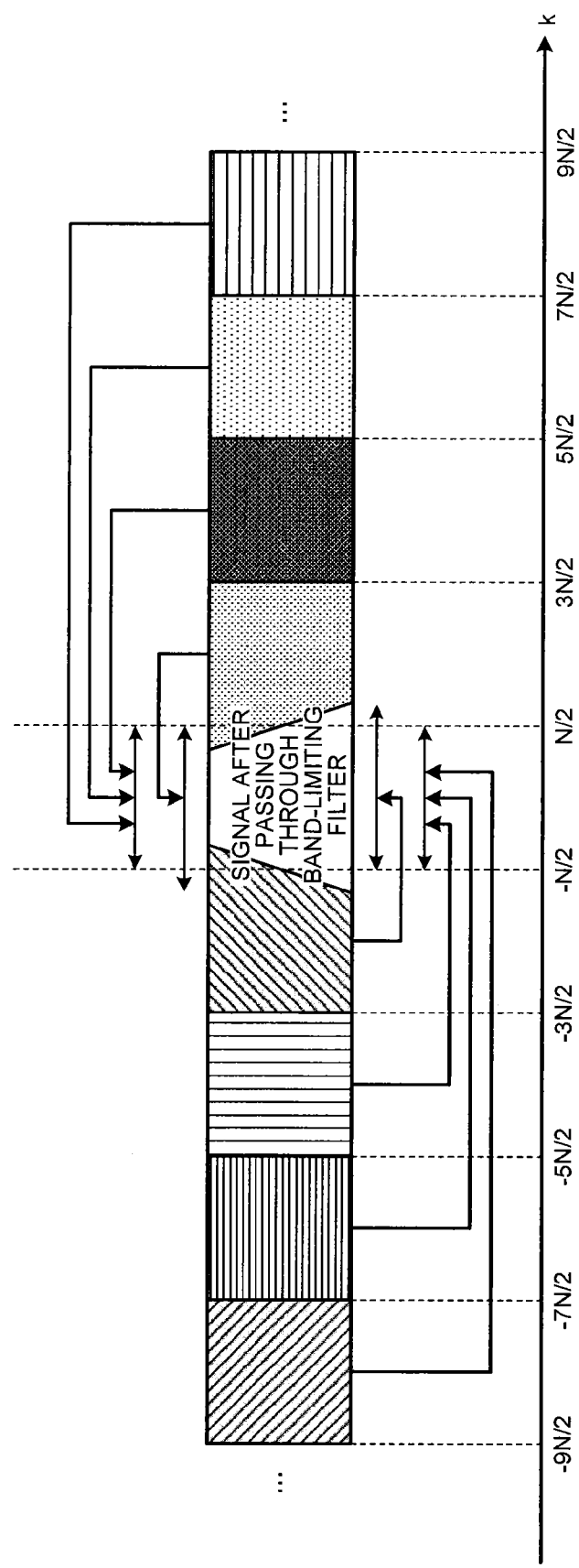
FIG. 6 is an example of a self-folding operation.

FIG. 6 depicts a self-folding operation performed according to equations (6) to (9) mentioned above.

Figure 7:
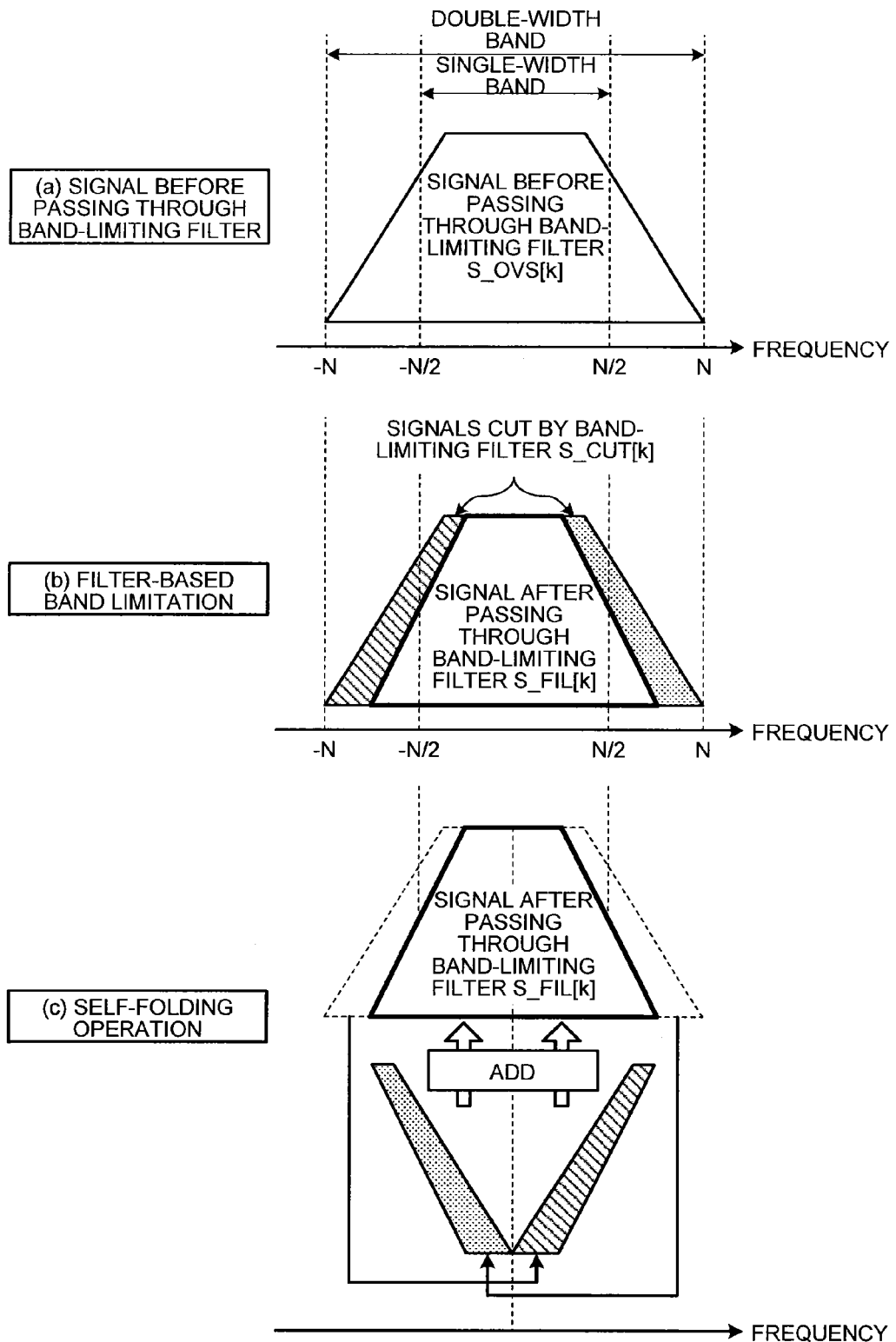
FIG. 7 is an example of a self-folding operation in a case where the number of oversampling is two.
Figure 8:
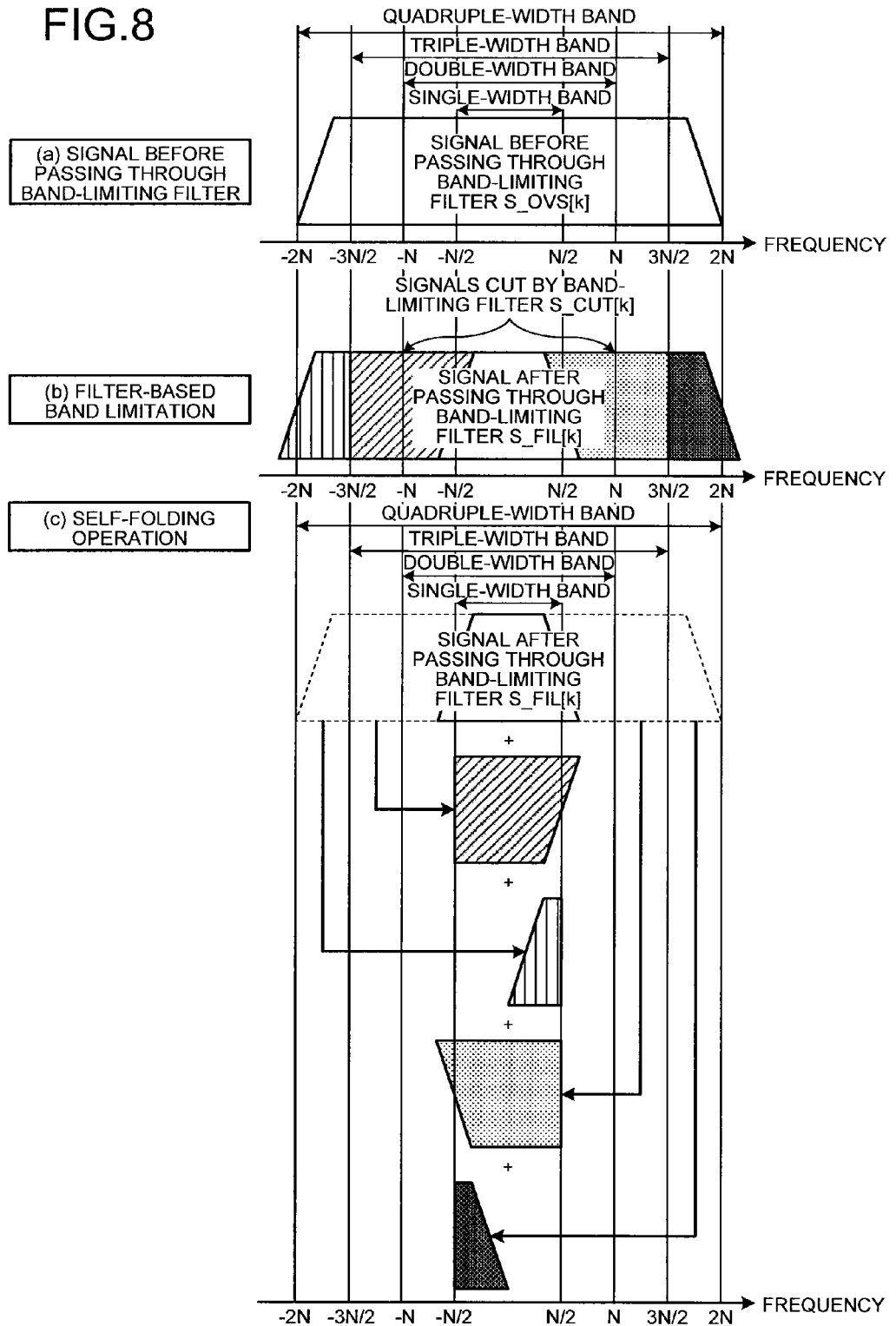
FIG. 8 is an example of a self-folding operation in a case where the number of oversampling is four.

Furthermore, FIG. 7 is an example of a self-folding operation in a case where the oversampling number V is two. Because of V=2, the signal is defined as −N≤k<N according to the equation (10). Further, FIG. 8 is an example of a self-folding operation in a case where the oversampling number V is four. Because of V=4, the signal is defined as −2N≤k<2N according to the equation (10).

As described above, the self-folding operation unit 23 adds a part of or all of the signals S_CUT[k] to the signal S_FIL. That is, it is not necessary to add all the signals S_CUT[k] to the signal S_FIL but it suffices to add a part of the signals S_CUT[k] to the signal S_FIL for k satisfying −VN/2≤k<VN/2. When the self-folding operation unit 23 makes the addition for a part of k satisfying −VN/2≤k<VN/2, an arbitrary method of selecting k can be used. However, it is possible to make the smaller degradation in the error rate as the addition is made for the more k.

An example of adding a part of the signals S_CUT[k] to the signal S_FIL is shown.

Figure 9:
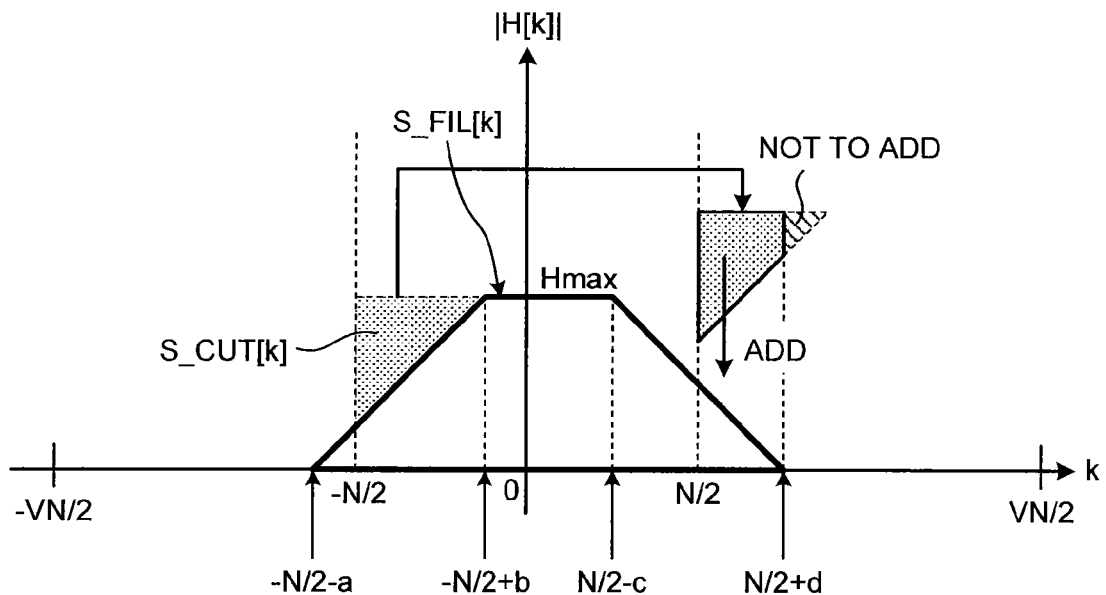
FIG. 9 is an example of a self-folding operation.

By using the band-limiting filter 22 having the characteristics shown in FIG. 5, the band of the signal S_FIL[k] after passing through the filter is limited to −N/2−a≤k<N/2+d. However, when the addition of signals is made according to the equations (6) and (8) at the time of the self-folding operation, the signals are possibly added in ranges N/2+d≤k<N and −N≤k<−N/2−a of the signal S_FIL[k]. As a result, the band of the signal S_FOLD[k] is possibly wider than that of the S_FIL[k]. To prevent this, it is considered to adopt a method of not adding the signals in the ranges of N/2+d≤k<N and −N≤k<−N/2−a (see FIG. 9). Needless to mention, all of the signals S_CUT[k] can be added to the signal S_FIL as long as no problem occurs even when the band of the signal S_FOLD[k] is possibly wider than that of the signal S_FIL[k].

Alternatively, the signals S_CUT[k] in a range of TH_L≤k<TH_H can be added to the signal S_FIL as a simpler method. In this case, TH_L and TH_H are arbitrary real numbers.

By performing the self-folding operation described above, the signals once cut by the band-limiting filter 22 are returned again into the transmission signal. Therefore, the waveform distortions generated in the first embodiment can be reduced. Furthermore, it is possible to realize a PAPR equivalent to that according to the first embodiment without greatly increasing the PAPR because the same signals are merely folded within the band.

The signal S_FOLD[k] generated by the self-folding operation described above is input to the IDFT unit 24 and transformed into a time domain signal by a VN-point IDFT (Inverse Discrete Fourier Transform). Subsequent operations are similar to those described in the first embodiment.

The DFT/IDFT processes in the present embodiment can be replaced by FFT/IFFT when the number of points is a power of two.

As described above, in the present embodiment, the band-limiting filter 22 performs the band limitation in the frequency domain. Conventionally, the band-limiting filter often performs the band limitation not in the frequency domain but in the time domain. In that case, the signals S_CUT[k] cut by the filter cannot be obtained.

Accordingly, in the present embodiment, the band limitation is performed in the frequency domain using the band-limiting filter.

The DFT unit 21, the band-limiting filter 22, the self-folding operation unit 23, and the IDFT unit 24 perform the processes on the signal having the length VN. Accordingly, when the length of a signal input from the phase interpolation unit 12 is L and the length L is larger than VN, the signal is then divided into signals each having the length VN and the divided signals are subjected to the processes performed by the DFT unit 21 and the following units. The signals each having the length VN output from the IDFT unit 24 are combined to be returned again to the signal having the length L.

Figure 10:
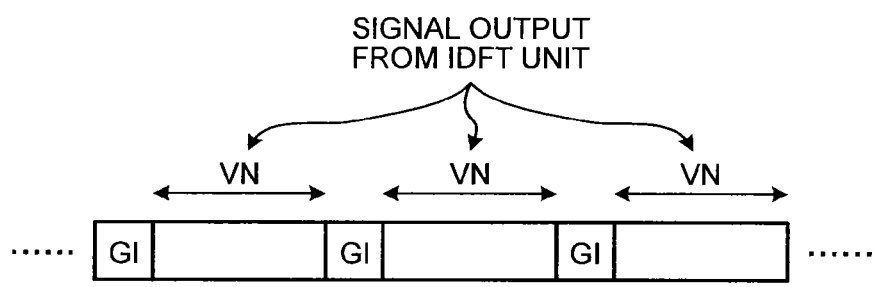
FIG. 10 is an example of a transmission signal having a GI inserted therein.
Figure 11:
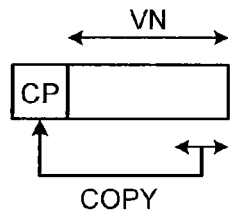
FIG. 11 is an example of a CP inserted in a transmission signal.
Figure 12:
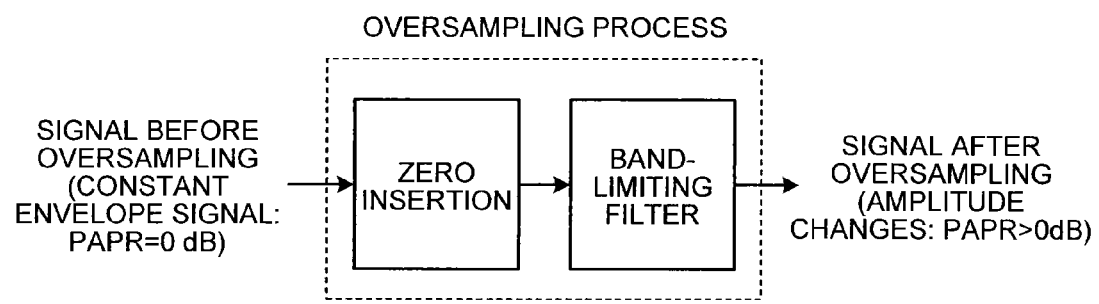
FIG. 12 is an outline of an oversampling process.

At the time of combining the signals each having the length VN output from the IDFT unit 24, a signal discontinuity possibly causes a problem. Therefore, at the time of combining the signals each having the length VN output form the IDFT unit 24, signals referred to as "guard interval (GI)" can be inserted as shown in FIG. 10. These guard intervals are equivalent to those normally used in OFDM (Orthogonal Frequency Division Multiplexing). Anything can be included in the guard intervals as contents, because guard intervals are discarded without being demodulated at the receiver. The contents can be all zeros or copies of an end part of the signal having the length VN as shown in FIG. 11. The guard interval shown in FIG. 11 is particularly referred to as "cyclic prefix (CP)".

While the root roll-off filter is normally and often used as the band-limiting filter, the type of the filter is not limited to any specific one in the present embodiment similarly to the first embodiment. The effect that the self-folding operation can completely cut the influence of the waveform distortions generated by the band-limiting filter irrespectively of the type of the filter is described below while referring to mathematical expressions. While the effect is described on the assumption that the oversampling number V is two for the brevity of descriptions, the same holds true for a case of V>2.

It is defined that the signal before being subjected to the phase interpolation is the constant envelope signal s(n) represented by the equation (1) described above. To consider better filter conditions, consider a case of subjecting this signal to double phase interpolation first and expressing the signal after the self-folding operation by a mathematical expression for a case of further subjecting the resultant signal to the self-folding operation.

When it is defined that the signal s(n) subjected to an N-point DFT is S[k], this signal S[k] is represented by the following equation (11).

$$S[k] = \sum_{n=0}^{N-1} s(n) e^{-j\frac{2\pi}{N}nk} \tag{11}$$

It is defined that the signal obtained by double-interpolating the signal s(n) is s_ovs(n). When a result obtained by subjecting the signal_(n) to a 2N-point DFT is defined as S_OVS[k], this is a sequence having a length 2N and represented by the following equation (12). In the equation (12), A[k] is obtained by subjecting only added N signals to the N-point DFT at the time of double-interpolating the signal s(n).

$$S\_OVS[k] = \sum_{n=0}^{2N-1} s\_ovs(n) e^{-j\frac{2\pi}{2N}nk} \tag{12}$$

$$= \sum_{n=0}^{N-1} \left( s\_ovs(2n) e^{-j\frac{2\pi}{2N} \cdot 2n \cdot k} + s\_ovs(2n+1) e^{-j\frac{2\pi}{2N} \cdot (2n+1)k} \right)$$

$$= \sum_{n=0}^{N-1} \left( s\_ovs(2n) + s\_ovs(2n+1) e^{-j\frac{\pi}{N}k} \right) e^{-j\frac{2\pi}{N}nk}$$

$$= \sum_{n=0}^{N-1} \left( s(n) + s\_ovs(2n+1) e^{-j\frac{\pi}{N}k} \right) e^{-j\frac{2\pi}{N}nk}$$

$$(\because s\_ovs(2n) = s(n))$$

$$= S[k] + e^{-j\frac{\pi}{N}k} \sum_{n=0}^{N-1} s\_ovs(2n+1) e^{-j\frac{2\pi}{N}nk}$$

$$= S[k] + e^{-j\frac{\pi}{N}k} A[k] \left( \because A[k] = \sum_{n=0}^{N-1} s\_ovs(2n+1) e^{-j\frac{2\pi}{N}nk} \right)$$

It is defined that the frequency characteristics of the band-limiting filter are H[k] (0≤k<2N). It is also defined that the maximum value of the |H[k]| is $H_{max}$. When it is defined that the signal obtained by band-limiting the signal S_OVS[k] by using this filter is S_FIL[k] and the signals cut by this filter are S_CUT[k], these signals are represented by the following equations (13).

$$S\_FIL[k] = S\_OVS[k]H[k] \quad (0 \le k < 2N)$$

$$S\_CUT[k] = S\_OVS[k](H_{max} - H[k]) \quad (0 \le k < 2N) \tag{13}$$

When it is assumed that the signal obtained by being further subjected to the self-folding operation is S_FOLD[k], this signal is represented by the following equation (14) or (15).

When $0 \le k < N$, $$\begin{aligned} S\_FOLD[k] &= S\_FIL[k] + S\_CUT[k+N] \\ &= S\_OVS[k]H[k] + S\_OVS[k+N] \cdot (H_{max} - H[k+N]) \\ &= \left( S[k] + e^{-j\frac{\pi}{N}k} A[k] \right) \cdot H[k] + \\ &\quad \left( S[k+N] + e^{-j\frac{\pi}{N}(k+N)} A[k+N] \right) \cdot (H_{max} - H[k+N]) \\ &= \left( S[k] + e^{-j\frac{\pi}{N}k} A[k] \right) \cdot H[k] + \left( S[k] - e^{-j\frac{\pi}{N}k} A[k] \right) \cdot \\ &\quad (H_{max} - H[k+N]) \\ &\quad (\because S[k+N] = S[k], A[k+N] = A[k]) \\ &= S[k] \cdot (H_{max} - H[k+N] + H[k]) + e^{-j\frac{\pi}{N}k} A[k] \cdot \\ &\quad (H[k] + H[k+N] - H_{max}) \end{aligned} \tag{14}$$

When $N \le k < 2N$, $$\begin{aligned} S\_FOLD[k] &= S\_FIL[k] + S\_CUT[k-N] \\ &= S\_OVS[k]H[k] + S\_OVS[k-N] \cdot (H_{max} - H[k-N]) \\ &= \left( S[k] + e^{-j\frac{\pi}{N}k} A[k] \right) \cdot H[k] + \\ &\quad \left( S[k-N] + e^{-j\frac{\pi}{N}(k-N)} A[k-N] \right) \cdot (H_{max} - H[k+N]) \\ &= \left( S[k] + e^{-j\frac{\pi}{N}k} A[k] \right) \cdot H[k] + \left( S[k] - e^{-j\frac{\pi}{N}k} A[k] \right) \cdot \\ &\quad (H_{max} - H[k-N]) \\ &\quad (\because S[k-N] = S[k], A[k-N] = A[k]) \\ &= S[k] \cdot (H_{max} - H[k-N] + H[k]) + e^{-j\frac{\pi}{N}k} A[k] \cdot \\ &\quad (H[k] + H[k-N] - H_{max}) \end{aligned} \tag{15}$$

Next, when it is defined that the signal after being subjected to the IDFT is s_fold(n), the signal s_fold(n) is represented by the following equation (16).

$$\begin{aligned} s\_fold(n) &= \frac{1}{2N} \sum_{k=0}^{2N-1} S\_FOLD[k] e^{j\frac{2\pi}{2N}nk} \\ &= \frac{1}{2N} \left( \sum_{k=0}^{N-1} S\_FOLD[k] e^{j\frac{2\pi}{2N}nk} + \sum_{k=N}^{2N-1} S\_FOLD[k] e^{j\frac{2\pi}{2N}nk} \right) \\ &= \frac{1}{2N} \left( \sum_{k=0}^{N-1} S\_FOLD[k] e^{j\frac{2\pi}{2N}nk} + \right. \\ &\quad \left. e^{j\pi n} \sum_{k=0}^{N-1} S\_FOLD[k+N] e^{j\frac{2\pi}{2N}nk} \right) \end{aligned} \tag{16}$$

($\because$ because of substitution of $k \rightarrow k + N$ in second term)

$$= \frac{1}{2N} \sum_{k=0}^{N-1} (S\_FOLD[k] + (-1)^n S\_FOLD[k+N]) e^{j\frac{2\pi}{2N}nk}$$

-continued $$(0 \leq n < 2N)$$

The signal s_fold(n) is represented as follows when being divided into a case where n is an even number and a case where n is an odd number.

[Equation 10]

$$s\_fold(2n) = \frac{1}{2N}\sum_{k=0}^{N-1}(S\_FOLD[k] + S\_FOLD[k+N])e^{j\frac{2\pi}{N}nk} \quad (17)$$

$$(0 \leq n < N)$$

$$s\_fold(2n+1) = \frac{1}{2N}\sum_{k=0}^{N-1}(S\_FOLD[k] - S\_FOLD[k+N])e^{j\frac{\pi}{N}k}e^{j\frac{2\pi}{N}nk}$$

$$(0 \leq n < N)$$

The signal is double-oversampled and the receiver performs a demodulation process on the received signal after downsampling the signal. Because a signal s_fold(2n+1) corresponds to the signal inserted for the oversampling, the receiver cuts the signal during the downsampling. Accordingly, only a signal s_fold(2n) has an influence on the error rate characteristics of the receiver.

To derive the s_fold(2n), S_FOLD[k]+S_FOLD[k+N] is calculated for 0≤k<N using the equations (14) and (15) as follows.

$$S\_FOLD[k] + S\_FOLD[k+N] \quad (18)$$

$$= S[k](H_{max} - H[k+N] + H[k]) + e^{-j\frac{\pi}{N}k}A[k](H[k] + H[k+N] - H_{max}) +$$

$$S[k+N](H_{max} - H[k] + H[k+N]) + e^{-j\frac{\pi}{N}(k+N)}A[k+N](H[k+N] + H[k] - H_{max})$$

$$= S[k](H_{max} - H[k+N] + H[k]) + e^{-j\frac{\pi}{N}k}A[k](H[k] + H[k+N] - H_{max}) +$$

$$S[k](H_{max} - H[k] + H[k+N]) - e^{-j\frac{\pi}{N}k}A[k](H[k+N] + H[k] - H_{max})$$

$$(\because S[k+N] = S[k], A[k+N] = A[k], e^{-j\pi} = -1)$$

$$= 2H_{max}S[k](0 \leq k < N)$$

Therefore, the signal_2n) is represented as follows.

$$s\_fold(2n) = \frac{1}{2N}\sum_{k=0}^{N-1}(S\_FOLD[k] + S\_FOLD[k+N])e^{j\frac{2\pi}{N}nk} \quad (19)$$

$$= \frac{2H_{max}}{N}\sum_{k=0}^{N-1}S[k]e^{j\frac{2\pi}{N}nk}$$

$$= H_{max}s(n) \quad (0 \leq n < N)$$

$$\left(\because s(n) = \frac{1}{N}\sum_{k=0}^{N-1}S[k]e^{j\frac{2\pi}{N}nk}\right)$$

As can be understood, the signal s_fold(2n) is a constant multiple (=$H_{max}$ times) of the signal s(n) that is not subjected to the phase interpolation yet. That is, the signal s_fold(2n) is free from the influence of the waveform distortions generated by the band-limiting filter. This indicates that the self-folding operation can prevent degradation in the error rate characteristics.

The fact that the self-folding operation can prevent degradation in the error rate characteristics resulting from waveform distortions generated by the band-limiting filter has been described above by using the mathematical expressions. In the explanations using the mathematical expressions, the fact that the oversampling is performed by phase interpolation and the fact that the modulated signal s(n) is a constant envelope signal are not used. Therefore, the self-folding operation is applicable to any cases as long as it is for applying a filter to an oversampled signal. The self-folding operation is also applicable to a case of not using the phase interpolation and also to a case where the modulated signal is not a constant envelope signal.

For example, as one of methods of suppressing a PAPR of an OFDM signal, there is known a method referred to as "clip-and-filter". With this method, a process of cutting high-frequency components using the filter is repeatedly performed. At this time of the process, the self-folding operation is applied to the process, a part of or all of the out-of-band signals cut by the filter are added by being folded within the band, and it is thereby possible to prevent the degradation in the error rate characteristics.

As an example, FIG. 15 is an example of BER (Bit Error Rate) characteristics in a case of elements shown in FIG. 14. In FIG. 15, "FIRST EMBODIMENT" indicates a case of performing the oversampling only by the phase interpolation as described in the first embodiment, and "SECOND EMBODIMENT" indicates a case of performing the oversampling based on the phase interpolation and the self-folding operation as described in the second embodiment. As can be understood from FIG. 15, the BER characteristics improve by performing the self-folding operation. For example, as for the BER-1.0e-6 point, the BER characteristics improve by 1.6 dB.

In this way, the transmitter according to the present embodiment performs the band limitation on the signal and adds a part of or all of the signals (out-of-band signals) cut by the band-limiting filter to the band-limited signal by folding the part of or all of the signals (out-of-band signals) within the band in the frequency domain after performing the interpolation process through the same procedures as those according to the first embodiment. This can reduce the waveform distortions generated in the case of adopting the configuration of the transmitter according to the first embodiment, that is, the waveform distortion generated by applying the band-limiting filter after the phase interpolation. As a result, the problem of the degradation in the error characteristics in the transmitter according to the first embodiment can be reduced. Furthermore, the self-folding operation according to the present embodiment does not greatly increase the PAPR but can realize the PAPR equivalent to that according to the first embodiment because the self-folding operation is to simply fold the same signals within the band.

Industrial Applicability

As described above, the transmitter according to the present invention is useful as a transmitter that transmits a signal while suppressing a PAPR of the signal to be low, and is particularly suitable for a transmitter that generates a transmission signal by oversampling a constant envelope signal.

Reference Signs List 11 modulation unit, 12 phase interpolation unit, 13, 22 band-limiting filter, 14 D/A conversion unit, 15 power amplification unit, 16 antenna, 21 DFT unit, 23 self-folding operation unit, 24 IDFT unit.

The invention claimed is:

1. A transmitter that generates a transmission signal by oversampling a modulated signal, the transmitter comprising:
   a modulator that performs a modulation process on an information sequence and that generates a constant envelope signal;
   an interpolator that inserts a predetermined number of signals identical in amplitude to signal points of the constant envelope signal between the signal points so that signal points including original signal points are located equidistantly;
   a Fourier transformer that transforms a signal obtained after the interpolator has performed a signal insertion process into a frequency-domain signal;
   a band-limiting filter that performs band limitation on a frequency-domain signal output from the Fourier transformer;
   an adder that adds an out-of-band signal that is a signal cut by the band-limiting filter to an in-band signal that is a signal not cut by the band-limiting filter; and
   an inverse Fourier transformer that transforms a signal obtained after the adder has performed an addition process into a time domain signal,
   wherein the adder performs addition to the in-band signal by individually frequency-shifting components of the out-of-band signal based on respective distances to the in-band signal on a frequency axis and by adding the frequency-shifted components to the in-band signal.

2. The transmitter according to claim 1, wherein the adder performs addition to the in-band signal by adding a part of the out-of-band signal to the in-band signal.

3. The transmitter according to claim 1, wherein
   the interpolator performs V-times oversampling,
   when a length of the signal is defined as N, the Fourier transformer, the band-limiting filter, the adder, and the inverse Fourier transformer perform processes for every VN, and
   V and N are positive non-zero numbers.

4. A transmitter that generates a transmission signal by oversampling a modulated signal, the transmitter comprising:
   a modulator that performs a modulation process on an information sequence and that generates a constant envelope signal;
   an interpolator that inserts a predetermined number of signals identical in amplitude to signal points of the constant envelope signal between the signal points so that signal points including original signal points are located equidistantly;
   a signal converter that converts a signal obtained after the interpolator has performed a signal insertion process into a frequency-domain signal; and
   a band-limiting filter that performs band limitation on a frequency-domain signal output from the signal converter, and that adds an out-of-band signal that is a signal cut by the band limitation to an in-band signal that is a signal not cut by the band limitation, wherein
   when a bandwidth $W_1$ of the out-of-band signal exceeds a double of a bandwidth $W_2$ of the in-band signal, the band-limiting filter divides the out-of-band signal into a plurality of signal components based on the bandwidth $W_2$ with reference to a central frequency of the in-band signal, and individually adds the respective signal components obtained by division to the in-band signal.

5. The transmitter according to claim 4, wherein the band-limiting filter performs addition to the in-band signal by adding a part of the out-of-band signal to the in-band signal.

6. The transmitter according to claim 4, wherein the band-limiting filter performs addition to the in-band signal by individually frequency-shifting components of the out-of-band signal based on respective distances to the in-band signal on a frequency axis and by adding the frequency-shifted components to the in-band signal.

7. The transmitter according to claim 4, wherein
   the interpolator performs V-times oversampling,
   when a length of the signal is defined as N, the Fourier transformer, the band-limiting filter, and the inverse Fourier transformer perform processes for every VN, and
   V and N are positive non-zero numbers.

8. A transmission method executed by a transmitter that generates a transmission signal by oversampling a modulated signal, the transmission method comprising:
   a constant-envelope-signal generating step of performing a modulation process on an information sequence and generating a constant envelope signal;
   a signal inserting step of inserting a predetermined number of signals identical in amplitude to signal points of the constant envelope signal between the signal points so that signal points including original signal points are located equidistantly;
   a Fourier transforming step of transforming a signal obtained by performing the signal inserting step into a frequency-domain signal;
   a band-limiting step of performing band limitation on a frequency-domain signal obtained by performing the Fourier transforming step;
   an adding step of adding an out-of-band signal that is a signal cut at the band-limiting step to an in-band signal that is a signal not cut at the band-limiting step; and
   an inverse Fourier transforming step of transforming a signal obtained after an addition process has been performed at the adding step into a time domain signal,
   wherein the adding step includes individually frequency-shifting components of the out-of-band signal based on respective distances to the in-band signal on a frequency axis and adding the frequency-shifted components to the in-band signal.

9. The transmitter according to claim 2, wherein the part of the out-of-band signal is less than a whole of the out-of-band signal.

10. The transmitter according to claim 5, wherein the part of the out-of-band signal is less than a whole of the out-of-band signal.

* * * * *